(12) United States Patent
Finnell et al.

(10) Patent No.: US 6,625,428 B1
(45) Date of Patent: Sep. 23, 2003

(54) VOLTAGE STANDING-WAVE RATIO MEASUREMENT APPARATUS AND USE IN A CELLULAR COMMUNICATIONS SYSTEM

(75) Inventors: John Fitzgerald Finnell, Swindon (GB); Thomas Paul Groves, Newbury (GB); Peter William Bishop, Swindon (GB)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/482,999

(22) Filed: Jan. 13, 2000

(30) Foreign Application Priority Data

Jan. 30, 1999 (GB) ............................................. 9901993

(51) Int. Cl.⁷ .......................... H04B 17/00; H04B 1/04; G01R 13/08; G01R 31/00
(52) U.S. Cl. ................................ 455/115.1; 455/115.2; 455/115.3; 455/115.4; 455/124; 455/129; 455/423; 343/703; 324/501; 324/508; 324/512; 324/522; 324/531
(58) Field of Search ................................ 455/67.1, 115, 455/117, 123, 124, 126, 129, 115.1–115.4, 125, 67.11, 423–425; 324/501, 508, 512, 520, 522, 531, 534; 343/703; 333/17.1, 17.3, 100

(56) References Cited

U.S. PATENT DOCUMENTS 3,820,021 A * 6/1974 Clarisse ..................... 324/78 Q
3,887,471 A * 6/1975 Stotlar ........................ 250/338
4,580,092 A * 4/1986 Squire ....................... 324/57 R
4,630,228 A * 12/1986 Tarczy-Hornoch et al. . 364/576
5,436,846 A    7/1995 Fleming-Dahl
5,548,820 A * 8/1996 Victorin ..................... 455/67.4
6,323,486 B1 * 11/2001 Grossman et al. .......... 250/338

FOREIGN PATENT DOCUMENTS

EP          0479168 A2     9/1991
WO          WO89/02603     3/1989

* cited by examiner

Primary Examiner—William Trost
Assistant Examiner—Meless Zeawdu

(57) ABSTRACT

An apparatus for monitoring a cellular communications system; comprising a plurality of voltage standing-wave ratio (VSWR) measurement means located at respective connections to antennas of said communications system and at respective discontinuities in radio transmission lines to said distributed antennas; wherein each said VSWR measurement means is individually identifiable, has a respective threshold, and is arranged to compare its measured VSWR value to its respective threshold and identifiably indicate an error status if its measured VSWR value exceeds its threshold. Also described is a corresponding method of monitoring a cellular communications system. Also described is a VSWR measurement apparatus, and an antenna arrangement comprising an antenna and such a VSWR measurement apparatus.

8 Claims, 2 Drawing Sheets

VOLTAGE STANDING-WAVE RATIO MEASUREMENT APPARATUS AND USE IN A CELLULAR COMMUNICATIONS SYSTEM

FIELD OF THE INVENTION

The present invention relates to a voltage standing-wave ratio (VSWR) measurement apparatus. The present invention also relates to an apparatus for, and method of, monitoring a cellular communications system, particularly the radio transmission lines and antennas of such a system. The present invention is applicable to, but not limited to, cellular radio communication systems such as the Global System for Mobile communications (GSM), and also the Universal Mobile Telecommunication System (UMTS) currently under standardisation. The present invention is applicable to, but not limited to, picocellular arrangements.

BACKGROUND OF THE INVENTION

One type of communications system is a cellular communications system. In a cellular communications system, the area over which service is provided is divided into a number of smaller areas called cells. Typically each cell is served from a base transceiver station (BTS) which has a corresponding antenna or antennas for transmission to and reception from a user station, normally a mobile station. Presently established cellular radio communications systems include GSM systems (Global System for Mobile Communications).

Cellular communications systems can also include sub-cells arranged within the above mentioned cells. Such cells within cells are often called microcells. When different areas within a building or series of buildings are divided into different sub-cells, for example by having a radio transceiver on each floor providing a respective sub-cell, the sub-cells of such an arrangement are often called picocells.

In a typical arrangement of a cellular system, the antenna or antennas corresponding to a BTS are connected to said BTS via respective links, at least part of such a link being a radio link, for example in the form of a radio frequency (RF) radio transmission line. This will typically be implemented in the form of co-axial or otherwise screened cable, plus connections being required along such cable and at interfaces into other equipment as required by the practical layout arising.

A known method of monitoring transmission lines/antennas is to measure voltage standing-wave ratio (VSWR). The power reflected back along a transmission line from an antenna is compared to the power being sent along the transmission line to the antenna. In the case of an undamaged, correctly matched transmission line, antenna, combination there would only be a very low proportion of power reflected back, because the antenna would radiate the majority of power fed to it.

A disadvantage with carrying out VSWR monitoring, especially when there is a significant length of cable between the measurement point and the terminating antenna (s), as is often the case in cellular communications systems, has been found to be that losses in cables plus losses at connections can themselves account for a reduction in reflected power to an extent that even when an antenna is in error the monitoring method sees the result as acceptable. Furthermore, by their nature, cellular communications systems often have a large number of discontinuities in their radio transmission lines. The term discontinuity is used to describe points along a radio transmission line where the radio transmission line is split into more than one transmission line, for example so as to accommodate more than one antenna from a given radio transceiver unit. The term discontinuity also extends to any point along a radio transmission line where due to connections to specific equipment or similar arrangements it can be predicted, or it is discovered, that the characteristics of the radio transmission line are, or tend to be, affected or altered at that point. Yet further, the term discontinuity also extends to connections or joints between lengths of cable or patch panels. These discontinuities can result in mismatches in the radio transmission lines that reflect power back towards the transmission source and can cause remote VSWR measuring equipment to show a poor VSWR when the antennas are actually radiating satisfactorily, and additionally can mask the VSWR measurement of a antenna that is actually faulty or poorly matched.

The above disadvantages are particularly prevalent in a picocellular system where a large number of antennas are distributed in a building, resulting in a large number of such discontinuities.

SUMMARY OF THE INVENTION

The present invention addresses some or all of the above disadvantages by providing apparatus for detecting a fault in a system such as a cellular communications system and which apparatus includes voltage standing-wave ratio (VSWR) measurement apparatus.

The present invention advantageously allows for sensitive monitoring at different points along a radio transmission line, to a sensitivity level improved over what would be the case if only the whole link could be monitored as one item. Also, the present invention usefully indicates the location within the system of an irregular VSWR measurement. This is particularly useful in systems with distributed antennas, such as a system incorporating an in-building picocellular arrangement. The present invention also facilitates different threshold settings at different locations, accommodating different contributions of reflective power at different stages of a radio transmission line.

Additional specific advantages are apparent from the following description and figures which relate to a merely exemplary embodiment of the present invention.

DESCRIPTION OF AN EMBODIMENT OF THE INVENTION

The embodiment hereinafter described relates to a cellular communications system which is a GSM system, although it will be appreciated that the invention is not limited to such a system and can equally be used in other cellular communications systems, including other time division multiple access (TDMA) systems, code division multiple access (CDMA) systems, or combined TDMA-CDMA systems, and also the Universal Mobile Telecommunication System (UMTS) currently under standardisation.

Figure 1:
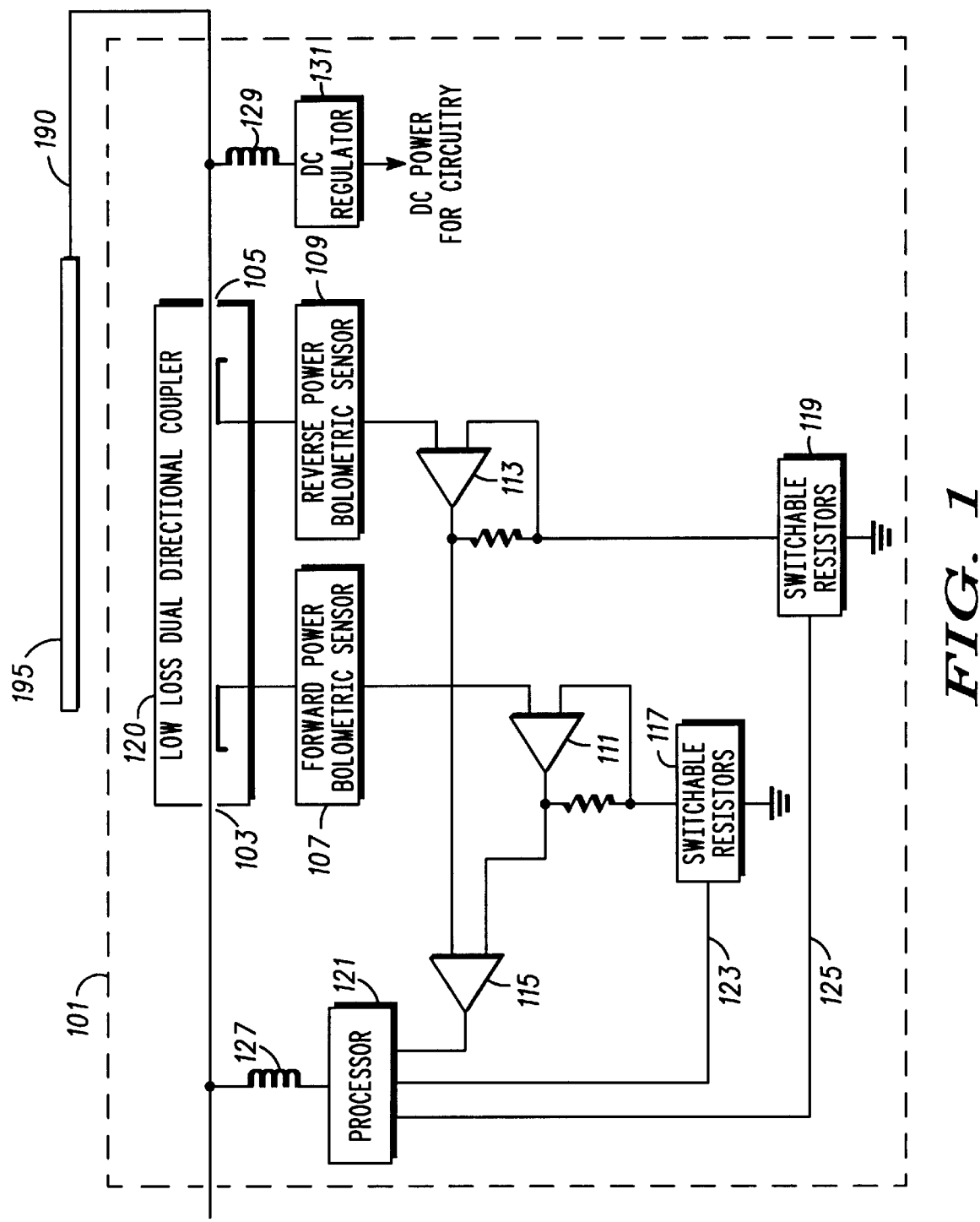
FIG. 1 is an illustration of a VSWR measurement means and antenna of an embodiment of the present invention.

In FIG. 1, the components contained in the dotted box represent a VSWR measurement means 101 of the present embodiment. VSWR measurement means 101 is shown on radio transmission line 190, which in this example is shown feeding into antenna 195. A low loss dual-directional coupler 120 has a first port 103 and a second port 105. First port 103 serves as an input to RF transmission being transmitted to the antenna. Second port 105 serves as an output to the same RF transmission, and also as an input to the reflected power reflected back from the antenna.

Two Bolometric power sensors are provided. The forward power sensor 107 determines the dc voltage of the forward power. Similarly, the reverse power sensor 109 determines the dc voltage of the reverse, i.e. reflected, power. The dc output from sensors 107 is fed into programmable amplifier 111 and the dc output from sensor 109 is fed into programmable amplifier 113. The voltages from the programmable amplifiers 111 and 113 are fed to the Schmitt trigger 115 and at the point where the dc volt age produced from the reflected power exceeds that produced from the forward power, the output of the trigger will change state.

In this way the VSWR measurement means effectively compares its measured VSWR value, i.e. function of ratio of reflected power to transmitted power, to its respective threshold, and indicates an error status, by means of the change of state of the output of the trigger, if its measured VSWR value exceeds its threshold. The effective level of the threshold is thus implemented in the present embodiment by virtue of setting the variable gains of programmable amplifiers as required. More particularly, this is achieved in the present embodiment by setting the switchable resistors shown as items 117 and 119 in FIG. 1. The switchable resistors 117 and 119 can be switched by processor 121 using control lines 123 and 125 respectively. In this fashion, the thresholds of different VSWR measurement means within the communications system can be set at different levels from each other, and also the threshold of a given VSWR measurement means is adjustable in that it can be changed from time to time. The implementation of threshold settings as described above may also need to take account of any differing coupling ratios between the forward and reverse coupling directions of dual directional coupler 120.

Also shown in FIG. 1 is RF blocking inductor 127 connecting processor 121 to the transmission line 190. RF blocking inductor 127 serves to allow low frequency signals containing instructions reach processor 121, whilst leaving the RF signal to continue along transmission line 190.

Also shown in FIG. 1 is RF blocking inductor 129. This takes dc power which is then regulated by dc regulator 131 to provide power for the electronic circuitry of the present embodiment.

Thus a self-contained apparatus is achieved that can be efficiently connected just on/to the radio transmission line itself. This excellently facilitates locating the VSWR measurement means at a connection to an antenna by integrating the VSWR measurement means in the same enclosure as the antenna. Thus, in the case of the present embodiment, antenna 195 and VSWR measurement means 101 are located in the same physical enclosure or casing. This is particularly useful when the cellular communications system is a picocellular system.

Figure 2:
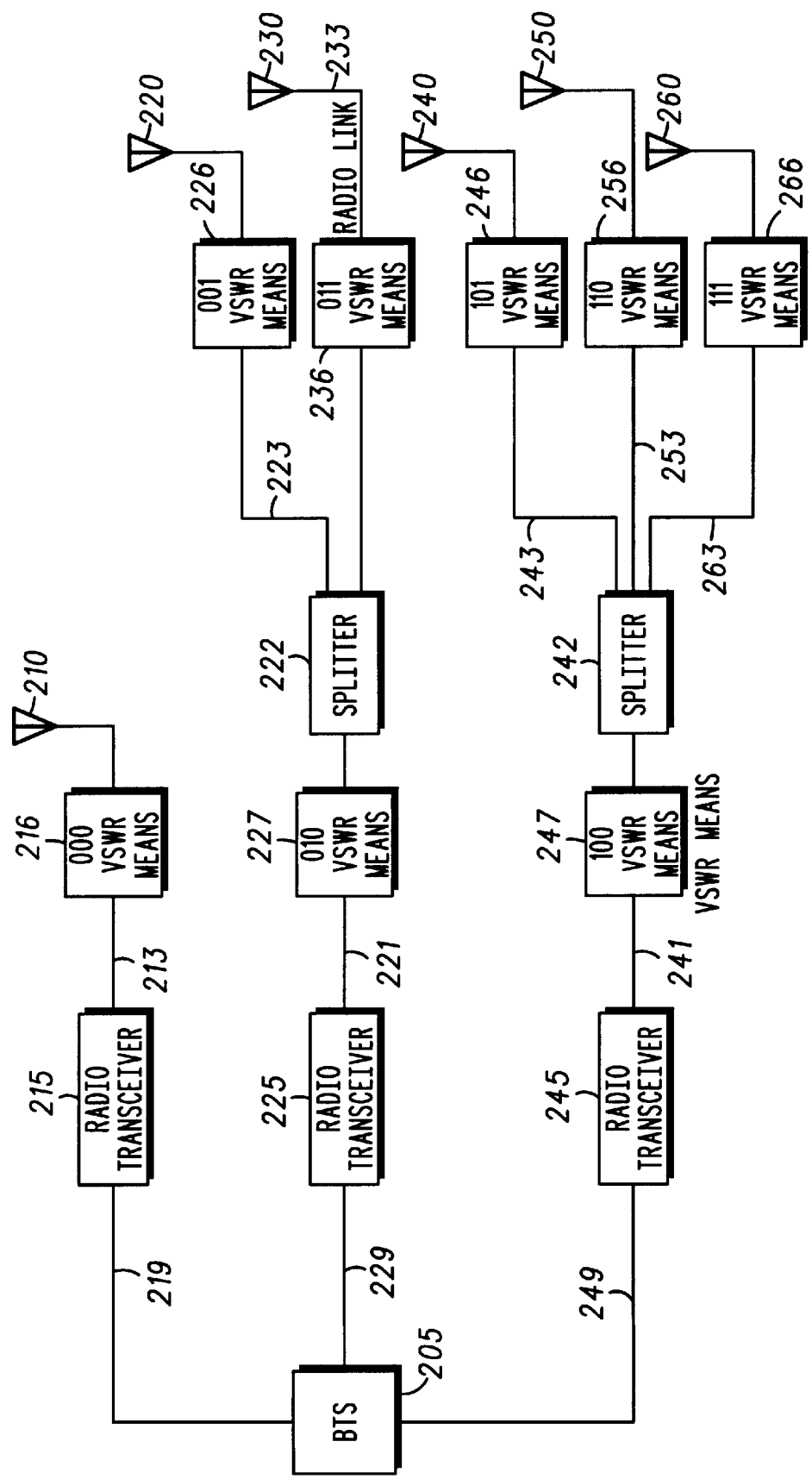
FIG. 2 is an illustration of a part of a cellular communications system, containing apparatus for monitoring the system according to an embodiment of the present invention.

A part of a cellular communications system, containing a distributed antenna arrangement and apparatus for monitoring the system according to the present embodiment is shown in FIG. 2. Base transceiver station (BTS) 205 feeds six different antennas.

The first antenna 210 is coupled to radio transceiver 215 via radio transmission line 213. In the present embodiment radio transmission line 213 is formed from co-axial cable such as RG58 or similar. Radio transceiver 215 is coupled to BTS 205 via a digital link which in the present embodiment consists of category 5 ether net cable. p The second antenna 220 and the third antenna 230 are both coupled to radio transceiver 225. Initially they are both coupled via the same radio transmission line 221, but, from splitter 222 onwards, antenna 220 is coupled via radio transmission line 223 whereas antenna 230 is coupled via radio transmission line 233.

The fourth antenna 240, the fifth antenna 250 and the sixth antenna 260 are all coupled to radio transceiver 245. Initially they are all coupled via the same radio transmission line 241, but, from splitter 242 onwards, antenna 240 is coupled via radio transmission line 243, antenna 250 is coupled via radio transmission line 253, and antenna 260 is coupled via radio transmission line 263.

In the present embodiment, eight individual VSWR measurement means, each as described earlier above and shown by the dotted area 101 of FIG. 1, are deployed. Also, of course, the radio transmission lines at the respective places of deployment correspond to the transmission line 190 as shown in FIG. 1.

Each antenna 210, 220, 230, 240, 250 260 has a respective VSWR measurement means 216, 226, 236, 246, 256, 266 located at the connection of the applicable radio link to that antenna. It is to be understood that the terminology "located at the connection" includes any type of proximal location whereby no significant losses or discontinuities can be reasonably expected on the radio link between the exact physical end of the VSWR measurement means and the exact start of the antenna itself. Thus lengths of cabling can exist between the true physical end of the VSWR measurement means and the actual antenna, but any such length would be insignificant compared to the overall length of the radio link.

Two further VSWR measurement means are employed in the present embodiment, each at a respective discontinuity in the radio transmission lines. VSWR measurement means 227 is located at splitter 222. It is noted that splitter 222 is considered to represent a discontinuity since the otherwise probably inherently sound radio transmission line in practice has to undergo connection to two separate lines via a number of physical connector means. Similarly, VSWR measurement means 247 is located at splitter 242.

Each VSWR measurement means is individually identifiable. In the present embodiment, unique digital identification codes are held by each VSWR measurement means consisting of numbers 1 to 8 in binary code, hence they are in the form of 3-bit code. If more than eight VSWR measurement means were present, then obviously more than 3 bits would be required in the code. Also, the invention is not limited to use of an n-bit code, in other embodiments other forms of identification coding will be used depending upon the details of the systems under consideration. In the present embodiment, the codes are held at the VSWR measurement means in the form of dual in line switches, interfacing it to the processor 121, that can be set to a specific code at the time of installation. This arrangement is shown schematically in FIG. 2 where VSWR measurement means 216 has identity 000, VSWR measurement means 226 has identity 001, VSWR measurement means 236 has identity 011, VSWR measurement means 246 has identity 101, VSWR measurement means 256 has identity 110, VSWR measurement means 266 has identity 111, VSWR measurement means 227 has identity 010, and VSWR measurement means 247 has identity 100.

When the output of the above described Schmitt trigger 115 changes state in one of the VSWR measurement means, this error status is identifiably indicated as follows. The change in status of the Schmitt trigger 115 is sensed by processor 121. The processor then serially transmits the relevant 3-bit identification code back to a controller. In the present embodiment the controller is contained within BTS 205, but in other embodiments the controller can be located at other locations within the communications system. The location will be chosen according to the requirements of the particular system under consideration. Thus, if the change of status occurred in VSWR measurement means 256, whose 3-bit code is 110, the processor would transmit the sequence 110110110110 . . . intermittently, until such time as the VSWR status changes due to a fault being rectified or a revised threshold being set. This signal is transmitted to the controller, in this case BTS 205, by appropriate means, in this case via radio transceiver 245 by multiplexing the transmission at low frequency on to the radio transmission lines 253 and 241, and by means of a bias tee at that radio transceiver 245 to extract the low frequency signal from the radio frequency signal, and thereafter using digital link 249 to BTS 205. Splitter 242 must allow such a signal to reach radio transceiver 245 and hence BTS 205, so the splitters needs to be designed appropriately with respect to the level of attenuation of the digital information that can be accommodated, in the present case by specification of their low-frequency cut-off points.

In the description of a VSWR measurement means earlier above, it was described how the switchable resistors 117 and 119 can be switched by processor 121 using control lines 123 and 125 respectively, thus providing adjustable threshold. It is further noted that remote adjustment is implemented in the present embodiment under the control of the controlling means, in this case BTS 205, by means of signalling from BTS 205 to respective processors 121 of the individual VSWR measurement means, identified using the above described 3-bit codes.

The present invention thus provides a number of advantages. By locating the VSWR measurement means at discontinuities and antennas, the main places likely to provide degraded system capability are individually monitored and identifiable. When further combined with remotely programmable adjustable threshold capability, sophisticated monitoring levels can be achieved that intelligently accommodate local minor problems in a way that would not be possible with unidentifiable fault indication covering long transmission routes with a number of discontinuities therein included. An efficient integrated antenna plus VSWR measurement apparatus or means can be provided, which is particularly useful for piceocellular systems. Furthermore, the effects of temperature variation on the VSWR measuring and threshold process are reduced, and hence the need for temperature compensation alleviated, when both the forward and reflected couplings of the VSWR measurement are located jointly as in dual-directional coupler 120 in the above described embodiment.

We claim:

1. Apparatus for detecting a fault in a system having a plurality of discontinuities, said apparatus including
   a plurality of voltage standing wave ratio (VSWR) measurement means for location at at least two of said discontinuities, each of said VSWR measurement means being individually identifiable, having a respective threshold value and comprising means for comparing its measured VSWR with its respective threshold and for identifiably indicating an error status if its measured VSWR value exceeds its threshold, and
   a radio transmission line incorporating a discontinuity therein and a connection to an antenna,
   wherein one of said VSWR measurement means is located at a transmission line discontinuity and another of said VSWR measurement means is located at an antenna connection.

2. A system as claimed in claim 1 in which said system is a cellular communications system.

3. Apparatus as claimed in claim 1 and further including means for adjusting said respective threshold values.

4. Apparatus as claimed in claim 1 in which each VSWR measurement means includes at least one dual-directional coupler.

5. Apparatus as claimed in claim 1 in which each VSWR measurement means includes two bolometric power sensors.

6. Apparatus as claimed in claim 3 in which the means for adjusting said respective threshold values comprises a programmable amplifier.

7. Apparatus claimed in claim 3 and including a first blocking inductor for coupling said means for adjusting said respective threshold values to the system.

8. Apparatus as claimed in claim 1 and including a second blocking inductor for receiving operating power from the system.

* * * * *